United States Patent
Yamatoya

(10) Patent No.: US 8,654,430 B2
(45) Date of Patent: Feb. 18, 2014

(54) ELECTRO-ABSORPTION MODULATOR AND OPTICAL SEMICONDUCTOR DEVICE

(75) Inventor: Takeshi Yamatoya, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 337 days.

(21) Appl. No.: 13/172,962

(22) Filed: Jun. 30, 2011

(65) Prior Publication Data

US 2012/0134383 A1    May 31, 2012

(30) Foreign Application Priority Data

Nov. 30, 2010    (JP) .................................. 2010-266113

(51) Int. Cl.
*G02F 1/01*    (2006.01)
(52) U.S. Cl.
USPC .............................................. 359/240; 257/2
(58) Field of Classification Search
USPC ........................................................ 359/240
See application file for complete search history.

(56) References Cited

U.S. PATENT DOCUMENTS

| 7,329,894 B2 | 2/2008 | Kitatani et al. |
| 2007/0051939 A1* | 3/2007 | Nakahara et al. ............... 257/14 |

FOREIGN PATENT DOCUMENTS

| JP | 8-330622 A | 12/1996 |
| JP | 11-54837 B2 | 2/1999 |
| JP | 11-145549 A | 5/1999 |
| JP | 11-261154 A | 9/1999 |
| JP | 2000-91705 A | 3/2000 |
| JP | 2006-303147 A | 11/2006 |
| JP | 2008-211141 A | 9/2008 |

\* cited by examiner

*Primary Examiner* — James Jones
(74) *Attorney, Agent, or Firm* — Leydig, Voit & Mayer, Ltd.

(57) ABSTRACT

An electro-absorption modulator includes: a semiconductor substrate; and an n-type InP cladding layer, an AlGaInAs light absorbing layer, an InGaAsP optical waveguide layer, and a p-type InP cladding layer, which are sequentially laminated on the semiconductor substrate. The InGaAsP optical waveguide layer includes a plurality of InGaAsP layers with different constitutions. The energy barrier between valence band edges of the InGaAsP layers is smaller than the energy barrier when the InGaAsP optical waveguide layer includes only one InGaAsP layer.

11 Claims, 5 Drawing Sheets

ENERGY BAND    ENLARGED SECTIONAL VIEW

ENERGY BAND    ENLARGED SECTIONAL VIEW

ENERGY BAND    ENLARGED SECTIONAL VIEW

ENERGY BAND    ENLARGED SECTIONAL VIEW

ELECTRO-ABSORPTION MODULATOR AND OPTICAL SEMICONDUCTOR DEVICE

BACKGROUND OF THE INVENTION

1. Field of the Invention

The present invention relates to an electro-absorption modulator used in an optical communications system, and an optical semiconductor device wherein an electro-absorption modulator and a semiconductor laser are integrated on a semiconductor substrate.

2. Background Art

In an electro-absorption modulator, a separated confinement hetero-structure, wherein an optical waveguide layer having larger band gap energy than that of the light absorbing layer and a larger refraction index than that of the clad layer is formed on both sides of a light absorbing layer, is used.

In an electro-absorption modulator having an AlGaInAs light absorbing layer, a large valence region energy barrier is formed between an AlGaInAs light absorbing layer or an AlGaInAs optical waveguide layer and a p-type InP clad layer. This energy barrier becomes a resistor component when holes generated by light absorption in the light absorbing layer flow in the p-type InP clad layer. Therefore, hole pileup occurs, which worsens the flow of holes, and the dynamic extinction ratio, modulation bandwidth, and chirping characteristics of the electro-absorption modulator are worsened A method for reducing the valence region energy barrier by the InGaAsP etching stopping layer formed between the AlInAs clad layer and the p-type InP clad layer has been proposed (for example, refer to Japanese Patent No. 3779040). However, the energy of the valence region cannot be sufficiently reduced by a single-layer InGaAsP layer. In addition, in the single-layer semiconductor laser based on AlGaInAs according to this background art, it is required to prevent the overflowing of electrons from the active layer into the p-type InP clad layer using an AlInAs layer. On the other hand, since the electro-absorption modulator is a reverse direction bias element, the overflow of electrons from the light absorbing layer to the p-type InP clad layer does not occur. Therefore, in the electro-absorption modulator, the use of the AlInAs layer is not required, and it is rather preferable not to use the AlInAs layer which has a high resistance and worsens the flow of the light absorbing current.

SUMMARY OF THE INVENTION

In the electro-absorption modulator having an AlGaInAs light absorbing layer as described above, since a large valence region energy barrier is formed between the AlGaInAs light absorbing layer or the AlGaInAs optical waveguide layer and the p-type InP clad layer, the characteristics are deteriorated.

In order to solve the above-described problem, it is an object of the present invention to improve the characteristics of the electro-absorption modulator having an AlGaInAs light absorbing layer.

According to the present invention, an electro-absorption modulator includes: a semiconductor substrate; and an n-type InP clad layer, an AlGaInAs light absorbing layer, an InGaAsP optical waveguide layer, and a p-type InP clad layer which are sequentially laminated on the semiconductor substrate. The InGaAsP optical waveguide layer includes a plurality of InGaAsP layers with different constitutions. The energy barrier between the valence regions of the plurality of InGaAsP layers is smaller than the energy barrier when the InGaAsP optical waveguide layer includes only one InGaAsP layer.

The present invention makes it possible to improve the characteristics of the electro-absorption modulator having an AlGaInAs light absorbing layer.

Other and further objects, features and advantages of the invention will appear more fully from the following description.

DETAILED DESCRIPTION OF THE PREFERRED EMBODIMENTS

An electro-absorption modulator and an optical semiconductor device according to the embodiments of the present invention will be described with reference to the drawings. The same components will be denoted by the same symbols, and the repeated description thereof may be omitted.

First Embodiment

Figure 1:
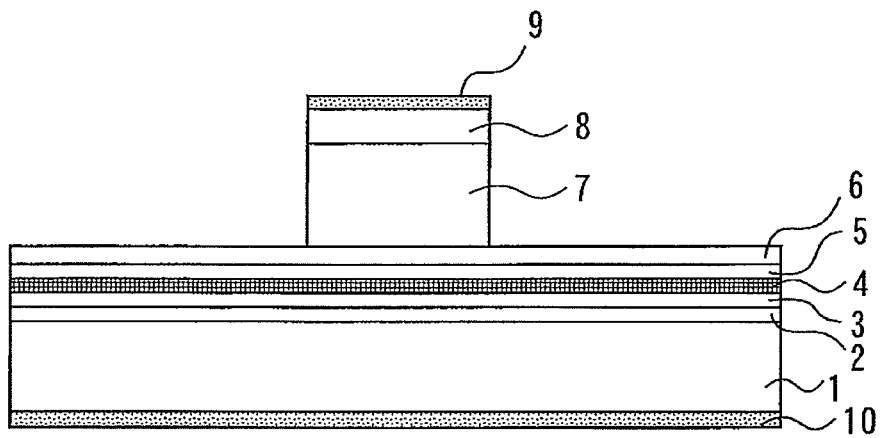
FIG. 1 is a sectional view showing an electro-absorption modulator according to the first embodiment of the present invention.

FIG. 1 is a sectional view showing an electro-absorption modulator according to the first embodiment of the present invention. An n-type InP clad layer 2, an AlGaInAs optical waveguide layer 3, an AlGaInAs light absorbing layer 4, a p-type AlGaInAs optical waveguide layer 5, a p-type InGaAsP optical waveguide layer 6, a p-type InP clad layer 7, and a p-type InGaAs contact layer 8 are sequentially laminated on an n-type InP substrate 1.

The AlGaInAs light absorbing layer 4 has an AlGaInAs/AlGaInAs multiple quantum well (MQW) structure. A p-side electrode 9 is formed on the p-type InGaAs contact layer 8, and an n-side electrode 10 is formed on the back face of the n-type InP substrate 1.

Figure 2:
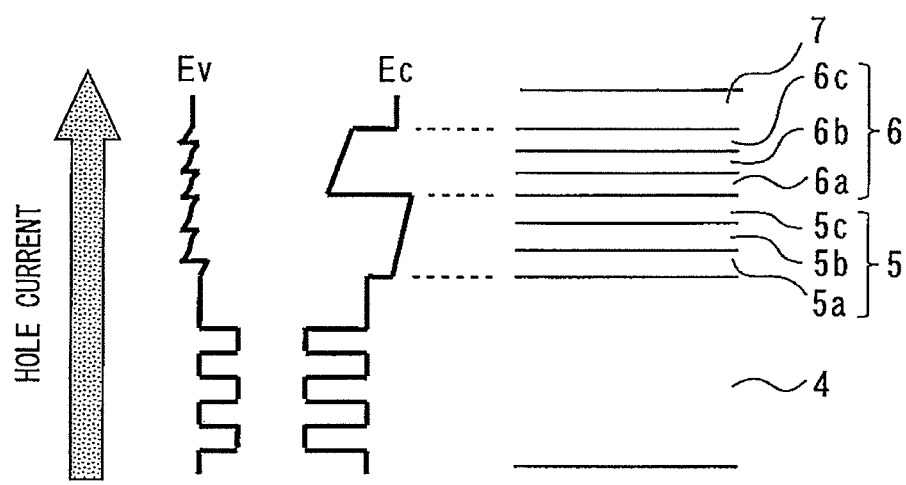
FIG. 2 is an enlarged sectional view from the light absorbing layer to the p-type clad layer of an electro-absorption modulator according to the first embodiment of the present invention, and an energy band diagram thereof.

FIG. 2 is an enlarged sectional view from the light absorbing layer to the p-type clad layer of an electro-absorption modulator according to the first embodiment of the present invention, and an energy band diagram thereof. The p-type AlGaInAs optical waveguide layer 5 has three AlGaInAs layers 5a, 5b, and 5c with different constitutions. The thickness of each of the AlGaInAs layers 5a, 5b, and 5c is 7 nm;

and the photo-luminescence (PL) wavelengths with different constitutions are 1,200 nm, 1,100 nm, and 950 nm, respectively.

The p-type InGaAsP optical waveguide layer 6 has three InGaAsP layers 6a, 6b, and 6c with different constitutions. The thickness of each of the InGaAsP layers 6a, 6b, and 6c is 7 nm; and the photo-luminescence wavelengths are 1,180 nm, 1,080 nm, and 1,000 nm, respectively. Thereby, the energy barrier between the valence regions of the InGaAsP layers 6a, 6b, and 6c is smaller than the energy barrier when the InGaAsP layer is a single layer.

Figure 3:
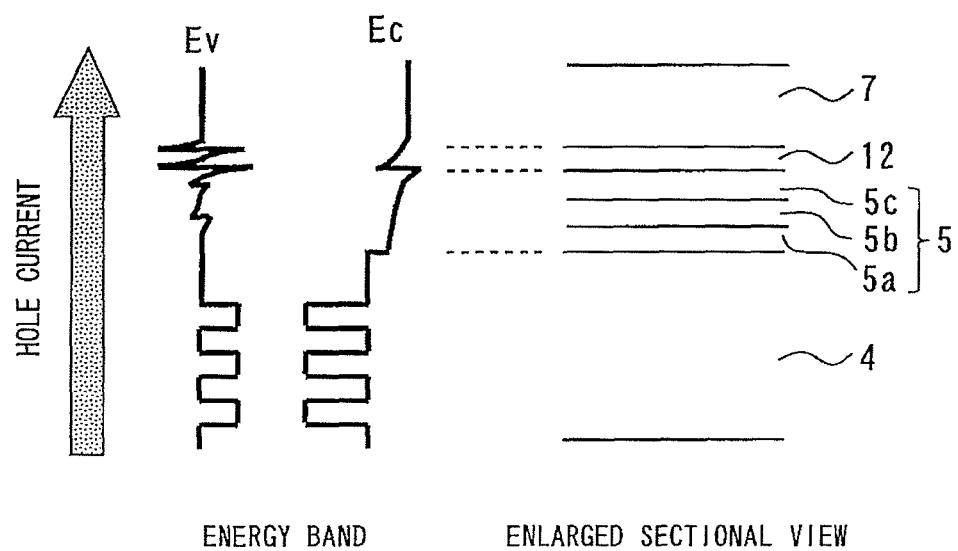
FIGS. 3, 4, and 5 are the enlarged sectional views of electro-absorption modulators according to the first, second, and third comparative examples; and the energy band diagrams thereof, respectively.
Figure 4:
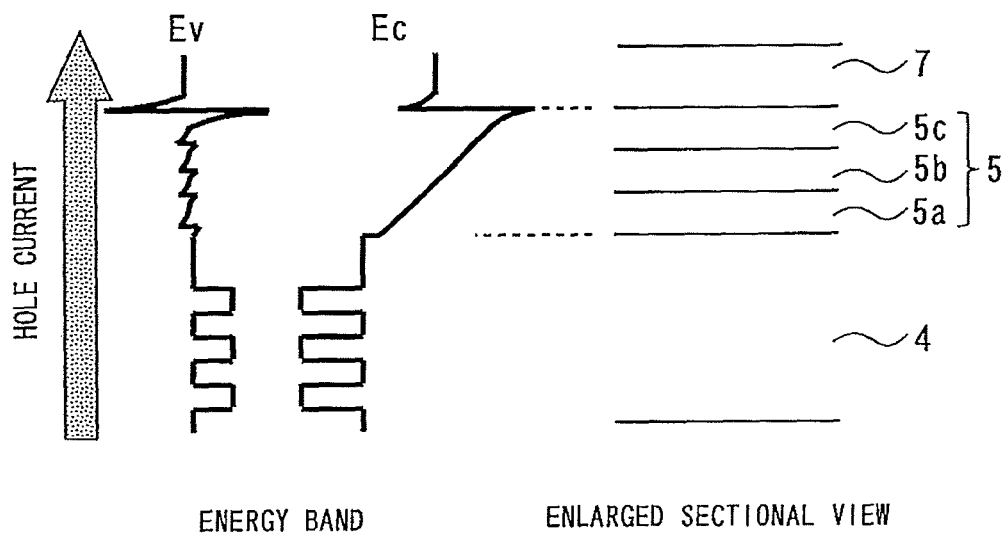
Figure 5:
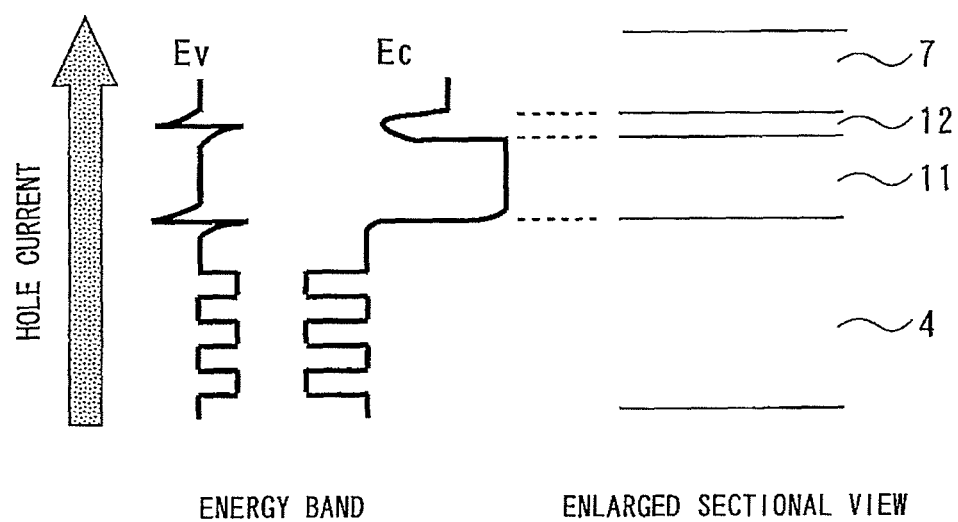

Next, the effect of the present embodiment will be described in comparison with first, second, and third comparative examples. FIGS. 3, 4, and 5 are the enlarged sectional views of electro-absorption modulators according to the first, second, and third comparative examples; and the energy band diagrams thereof, respectively. In the first comparative example, a p-type AlGaInAs optical waveguide layer 5, a p-type InGaAsP layer 12, and a p-type InP clad layer 7 are laminated on the AlGaInAs light absorbing layer 4. In the second comparative example, a p-type AlGaInAs optical waveguide layer 5 and a p-type InP clad layer 7 are laminated on the AlGaInAs light absorbing layer 4. In the third comparative example, a p-type AlInAs layer 11, a p-type InGaAsP layer 12, and a p-type InP clad layer 7 are laminated on the AlGaInAs light absorbing layer 4.

In the first comparative example, large energy barriers are formed in the valence region between the p-type AlGaInAs optical waveguide layer 5 and the p-type InGaAsP layer 12; and in the valence region between the p-type InGaAsP layer 12 and the p-type InP clad layer 7. In the second comparative example, a large energy barrier is formed in the valence region between the p-type AlGaInAs optical waveguide layer 5 and the p-type InP clad layer 7. In the third comparative example, large energy barriers are formed in the valence region between the AlGaInAs light absorbing layer 4 and the p-type AlInAs layer 11; and the valence region between the p-type InGaAsP layer 12 and the p-type InP clad layer 7. Therefore, a hole pileup occurs, which worsens the flow of holes, and the dynamic extinction ratio, the modulation bandwidth, and the chirping characteristics of the electro-absorption modulator are worsened.

Whereas in the present embodiment, the size of the energy barrier in the valence region between the AlGaInAs light absorbing layer 4 and the p-type InP clad layer 7 can be minimized by the p-type InGaAsP optical waveguide layer 6. Thereby, the resistance of the energy barrier is reduced, and the flow of the hole current is accelerated. As a result, the dynamic extinction ratio, the modulation bandwidth, and the chirping characteristics of the electro-absorption modulator can be improved.

It is also preferable for reducing the energy barrier of the valence regions between the AlGaInAs light absorbing layer 4 and the p-type InP clad layer 7 that the valence region energy of the p-type InP clad layer 7 is between the valence region energy of the AlGaInAs light absorbing layer 4 and the valence region energy of the p-type InP clad layer 7.

In addition, the size of the valence region energy barrier can be further reduced when the p-type InGaAsP optical waveguide layer 6 is of p-type. Furthermore, the size of the energy barrier between the AlGaInAs light absorbing layer 4 and the p-type InP clad layer 7 can be further reduced by placing the p-type AlGaInAs optical waveguide layer 5 between the AlGaInAs light absorbing layer 4 and the p-type InGaAsP optical waveguide layer 6.

Second Embodiment

Figure 6:
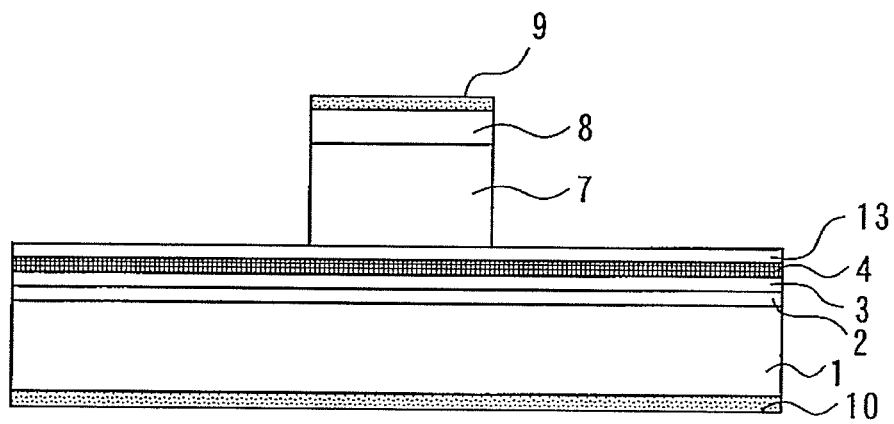
FIG. 6 is a sectional view showing an electro-absorption modulator according to the second embodiment of the present invention.

FIG. 6 is a sectional view showing an electro-absorption modulator according to the second embodiment of the present invention. A p-type InGaAsP optical waveguide layer 13 is formed in place of the p-type AlGaInAs optical waveguide layer 5 and the p-type InGaAsP optical waveguide layer 6 in the first embodiment. Other components are identical to the components of the first embodiment.

Figure 7:
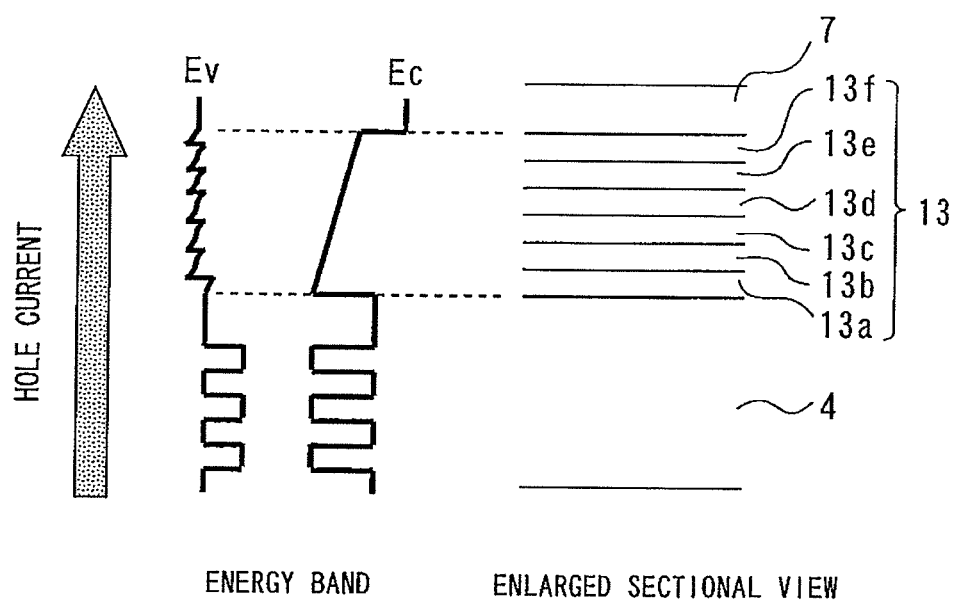
FIG. 7 is an enlarged sectional view from the light absorbing layer to the p-type clad layer of the electro-absorption modulator according to the second embodiment of the present invention, and an energy band diagram thereof.

FIG. 7 is an enlarged sectional view from the light absorbing layer to the p-type clad layer of the electro-absorption modulator according to the second embodiment of the present invention, and an energy band diagram thereof. The p-type InGaAsP optical waveguide layer 13 has six InGaAsP layers 13a, 13b, 13c, 13d, 13e, and 13f with different constitutions. The thickness of respective InGaAsP layers 13a, 13b, 13c, 13d, 13e, and 13f is 7 nm; and the photo-luminescence wavelengths are 1,500 nm, 1,400 nm, 1,280 nm, 1,180 nm, 1,080 nm, and 1,000 nm, respectively. Thereby, the energy barrier between the valence regions of InGaAsP layers 13a, 13b, 13c, 13d, 13e, and 13f is smaller than the energy barrier when the InGaAsP layer is a single layer.

By the present embodiment, p-type InGaAsP, the size of the energy barrier of the valence regions between the AlGaInAs light absorbing layer 4 and the p-type InP clad layer 7 can be minimized by the optical waveguide layer 13. Thereby, the resistance by the energy barrier is reduced, and the flow of the hole current is accelerated. As a result, the dynamic extinction ratio, the modulation bandwidth, and the chirping characteristics of the electro-absorption modulator can be improved.

Third Embodiment

Figure 8:
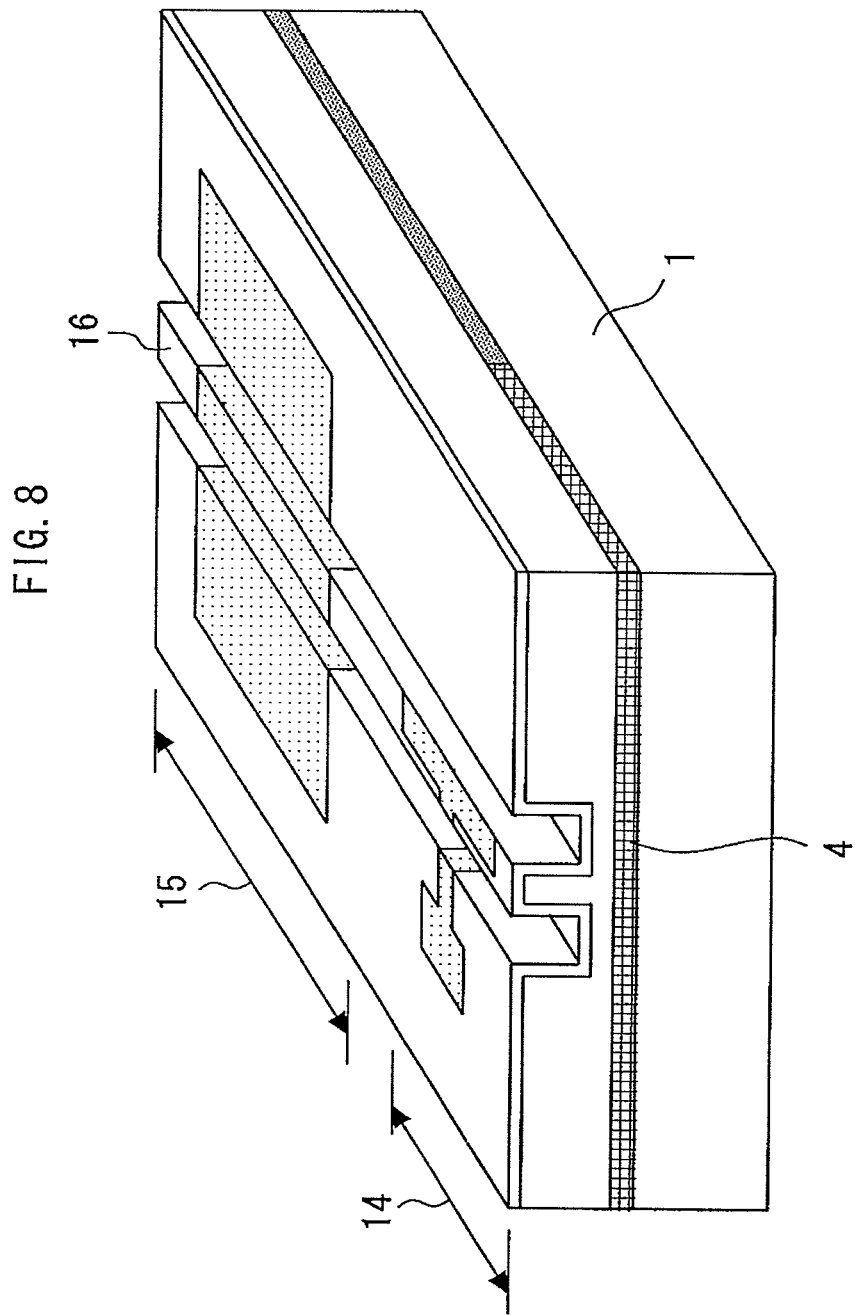
FIG. 8 is a perspective view showing an optical semiconductor device according to the third embodiment of the present invention.

FIG. 8 is a perspective view showing an optical semiconductor device according to the third embodiment of the present invention. On the n-type InP substrate 1, an electro-absorption modulator 14 and the semiconductor laser 15 of a distributed Bragg reflector (DBR) are stacked. The electro-absorption modulator 14 and the semiconductor laser 15 have a ridge waveguide 16. In the optical semiconductor device wherein such modulator and laser are integrated, by using the structure of the first and second embodiments as the electro-absorption modulator 14, an effect similar to the effects of the first and second embodiments can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-266113, filed on Nov. 30, 2010 including specification, claims, drawings and summary, on which the Convention priority of the present application is based, are incorporated herein by reference in its entirety.

What is claimed is:

1. An electro-absorption modulator comprising:
a semiconductor substrate; and
an n-type InP cladding layer, an AlGaInAs light absorbing layer, an InGaAsP optical waveguide layer, and a p-type InP cladding layer, which are sequentially laminated on the semiconductor substrate, wherein
the InGaAsP optical waveguide layer includes a plurality of InGaAsP layers with different constitutions, and
an energy barrier between valence band edges of the plurality of InGaAsP layers is smaller than a corresponding energy barrier when the InGaAsP optical waveguide layer includes only one InGaAsP layer.

2. The electro-absorption modulator according to claim 1, wherein valence band edge energy of the InGaAsP optical waveguide layer is between the valence band edge energy of the AlGaInAs light absorbing layer and the valence band edge energy of the p-type InP cladding layer.

3. The electro-absorption modulator according to claim 1, wherein the InGaAsP optical waveguide layer is p type.

4. The electro-absorption modulator according to claim 1, further comprising an AlGaInAs optical waveguide layer between the AlGaInAs light absorbing layer and the InGaAsP optical waveguide layer.

5. An optical semiconductor device comprising:
an electro-absorption modulator; and
a semiconductor laser, wherein
the electro-absorption modulator includes a semiconductor substrate, and an n-type InP cladding layer, an AlGaInAs light absorbing layer, an InGaAsP optical waveguide layer, and a p-type InP cladding layer, which are sequentially laminated on the semiconductor substrate,
the InGaAsP optical waveguide layer includes a plurality of InGaAsP layers with different constitutions,
an energy barrier between valence band edges of the plurality of InGaAsP layers is smaller than corresponding energy barrier when the InGaAsP optical waveguide layer includes only one InGaAsP layer, and
the electro-absorption modulator and the semiconductor laser are integrated on the semiconductor substrate.

6. The electro-absorption modulator according to claim 4, wherein the AlGaInAs optical waveguide layer includes a plurality of AlGaInAs layers with different constitutions.

7. An electro-absorption modulator comprising:
a semiconductor substrate; and
an n-type InP cladding layer, an AlGaInAs light absorbing layer, an InGaAsP optical waveguide layer, and a p-type InP cladding layer, which are sequentially laminated on the semiconductor substrate, wherein the InGaAsP optical waveguide layer includes a plurality of InGaAsP layers with different constitutions and respective different photoluminescent wavelengths, whereby energy barriers to holes at the valence band edge of the InGaAsP optical waveguide layer, within the InGaAsP optical waveguide layer, are smaller than energy barriers at the valence band edge of an InGaAsP optical waveguide layer constituted of a single InGaAsP layer of uniform constitution and a single photoluminescent wavelength.

8. The electro-absorption modulator according to claim 7, wherein valence band edge energy of the InGaAsP optical waveguide layer is between the valence band edge energy of the AlGaInAs light absorbing layer and the valence band edge energy of the p-type InP cladding layer.

9. The electro-absorption modulator according to claim 7, wherein the InGaAsP optical waveguide layer is p type.

10. The electro-absorption modulator according to claim 7, further comprising an AlGaInAs optical waveguide layer interposed between the AlGaInAs light absorbing layer and the InGaAsP optical waveguide layer.

11. The electro-absorption modulator according to claim 10 wherein the AlGaInAs optical waveguide layer includes a plurality of AlGaInAs layers with different constitutions and respective different photoluminescent wavelengths.

* * * * *